United States Patent

Suenaga et al.

[11] Patent Number: 5,745,845
[45] Date of Patent: Apr. 28, 1998

[54] RECEIVER WITH AUTOMATIC RECEIVING-STATION SWITCHING FUNCTION

[75] Inventors: Shoji Suenaga; Yuji Yamamoto; Toshihito Ichikawa; Takashi Miyake, all of Kawagoe, Japan

[73] Assignee: Pioneer Electronic Corporation, Tokyo, Japan

[21] Appl. No.: 454,676

[22] Filed: May 31, 1995

[30] Foreign Application Priority Data

Jun. 6, 1994  [JP]  Japan .................................. 6-124009

[51] Int. Cl.$^6$ .................................................. H04B 1/16
[52] U.S. Cl. .................... 455/194.1; 455/186.1; 455/212
[58] Field of Search ........................... 455/67.3, 186.1, 455/181.1, 212, 213, 218, 219, 220, 222, 226.2, 194.1, 200.1, 184.1

[56] References Cited

U.S. PATENT DOCUMENTS

| | | | |
|---|---|---|---|
| 5,050,234 | 9/1991 | Ohteru | 455/67.3 |
| 5,404,588 | 4/1995 | Henze | 455/186.1 |
| 5,428,825 | 6/1995 | Tomohiro et al. | 455/186.1 |
| 5,493,711 | 2/1996 | Koyama | 455/181.1 |

FOREIGN PATENT DOCUMENTS

| | | |
|---|---|---|
| 0 597 492 | 5/1994 | European Pat. Off. . |
| 3925629 | 7/1991 | Germany . |

Primary Examiner—Chi H. Pham
Attorney, Agent, or Firm—Evenson, McKeown, Edwards & Lenahan, PLLC

[57] ABSTRACT

A receiver with an automatic receiving-station switching function for automatically switching a current receiving frequency from a reception frequency of a broadcast wave in reception to a reception frequency of a broadcast wave of another station, which is in a good reception condition, when a reception condition of the former broadcast wave becomes poor. After detecting deterioration of the reception condition of a received signal, when the level of a detected signal obtained by detecting the received signal is kept equal to or lower than a threshold value for a predetermined time or longer, the receiver sets muting means to a signal cutoff state to stop the audio output before the activation of the automatic receiving-station switching function. Even if the reception condition becomes poor, the muting means does not cut off an audio signal until the low level of the audio output in the currently receiving broadcasted program continues.

6 Claims, 8 Drawing Sheets

RECEIVER WITH AUTOMATIC RECEIVING-STATION SWITCHING FUNCTION

BACKGROUND OF THE INVENTION

1. Field of the Invention

The present invention relates to a receiver with an automatic receiving-station switching function for automatically switching a current receiving frequency from the reception frequency of a broadcast wave in reception to the reception frequency of a broadcast wave of another station, which is in a good reception condition, when the reception condition of the former broadcast wave becomes poor.

2. Description of the Related Art

There is a radio data system (RDS) which can provide services to radio listeners by transmitting, in a multiplexed modulation form, broadcast information such as data regarding contents of a broadcasting program on a broadcasting station, and by selecting contents of a desired program on the basis of data obtained by demodulating the transmitted data on a receiver side. The radio data system uses, as a sub carrier, the third harmonic of 57 kHz of a stereo pilot signal of 19 kHz, which is out of the frequency band of an FM broadcast wave. The radio data system then subjects this sub carrier to a carrier suppression amplitude modulation with a data signal indicating information regarding broadcasting such as contents of a filtered and biphase-coded program. The resultant signal is a radio data signal (hereinafter called "RDS signal"). The radio data system performs frequency modulation to a main carrier by using the amplitude-modulated sub carrier to obtain a radio broadcast wave.

The RDS signal is repeatedly transmitted in a multiplexed manner with 104 bits as one group, as apparent from a baseband coding structure shown in FIG. 1. One group has four blocks 1 to 4 each consisting of 26 bits and each block includes 16-bit information word and a 10-bit check word. In FIG. 2, the block 1 contains program identification (PI) data representing a network, the block 2 contains traffic program identification (TP) data and traffic announce identification (TA) data, the block 3 contains alternative frequency (AF) data of network stations which are broadcasting the same program, and the block 4 contains program service name (PS) data like the name of a broadcasting station or the name of a network. Each group is classified by four bits into one of 16 types 0 to 15 in accordance with the contents of the group. There are two versions, A and B, defined for each type (0-15). The type identification code $B_O$ is located in the block 2. AF data of network stations is transmitted only in the group of the type 0A.

As regards a receiver installed on a vehicle, the reception condition of a broadcast wave in reception becomes poor as the vehicle travels in some cases. As mentioned above, the AF data of the network stations which are broadcasting the same program can be obtained from a single RDS broadcast wave received in the RDS broadcasting system. Therefore, the on-vehicle receiver may be equipped with a network follow function that uses the AF data to automatically switch the current receiving frequency to the frequency of another station in the same network broadcasting the same program, which is in a good reception condition. More specifically, the PI data and AF data multiplexed on the received broadcast wave are demodulated, and the resultant AF data is stored by each PI data as an AF data list provided in a predetermined area in a memory. When the reception condition of a program currently received from one broadcasting station becomes poor, AF data corresponding to the same PI data is read in turn from the AF data list, and another broadcasting station in the same group of network stations is automatically selected on the basis of the AF data. This always permits the user of the receiver to listen to the same program in a good reception condition.

When the deterioration of the reception condition of a broadcast wave in reception is detected, this network follow function immediately cuts off the audio output (so-called audio mute condition) in order to check whether or not the reception condition of the station newly selected on the basis of the AF data in the AF data list is in a good reception condition, thus preventing noises like a interstation noise from being output from a loudspeaker at the time of switching the current receiving frequency. This audio mute condition continues until another broadcasting station in the same group of network stations which provides a good reception condition is selected, or until the station selection returns to the station whose program the user has been receiving immediately before the activation of the network follow function when no stations in a good reception condition have been selected.

When the reception condition of the broadcast wave becomes poor, the receiver always enters the audio mute condition immediately if the network follow function is on. If the audio output level by the broadcast wave has been high, it varies extremely. In this case, the listener may feel uncomfortable.

SUMMARY OF THE INVENTION

Accordingly, it is a primary objective of the present invention to provide a receiver capable of reducing the uncomfortableness of a listener when the audio mute condition is established before the activation of an automatic receiving-station switching function such as a network follow function.

To achieve this object, according to the present invention, there is provided a receiver with an automatic receiving-station switching function for automatically switching a current receiving frequency from a reception frequency of a broadcast wave in reception to a reception frequency of a broadcast wave of another station, which is in a good reception condition, when a reception condition of the former broadcast wave becomes poor, the receiver comprising detection means for detecting a signal obtained by receiving a broadcast wave; detection level detecting means for generating a reset signal when a level of the detected signal is higher than a threshold value; reception condition detecting means for detecting deterioration of a reception condition of the received signal; first timer means for starting measuring a first predetermined time when the deterioration of the reception condition is detected and for restarting measuring the first predetermined time in response to the reset signal during time measurement of the first predetermined time; mute-ON instruction signal generating means for generating a mute-ON instruction signal when the first timer means finishes measuring the first predetermined time; muting means, inserted in a low-frequency stage to which the detected signal is supplied, for becoming a signal cutoff state in response to the mute-ON instruction signal; and means for activating the automatic receiving-station switching function after the muting means becomes the signal cutoff state.

According to the receiver embodying the present invention, after detecting deterioration of the reception condition of a received signal, when the level of the detected signal obtained by detecting the received signal is kept equal to or lower than the threshold value for a predetermined time or longer, the muting means is set to the signal cutoff state to stop the audio output before the activation of the automatic receiving-station switching function.

DETAILED DESCRIPTION OF THE PREFERRED EMBODIMENTS

Preferred embodiments of the present invention will now be described referring to the accompanying drawings.

Figure 3:
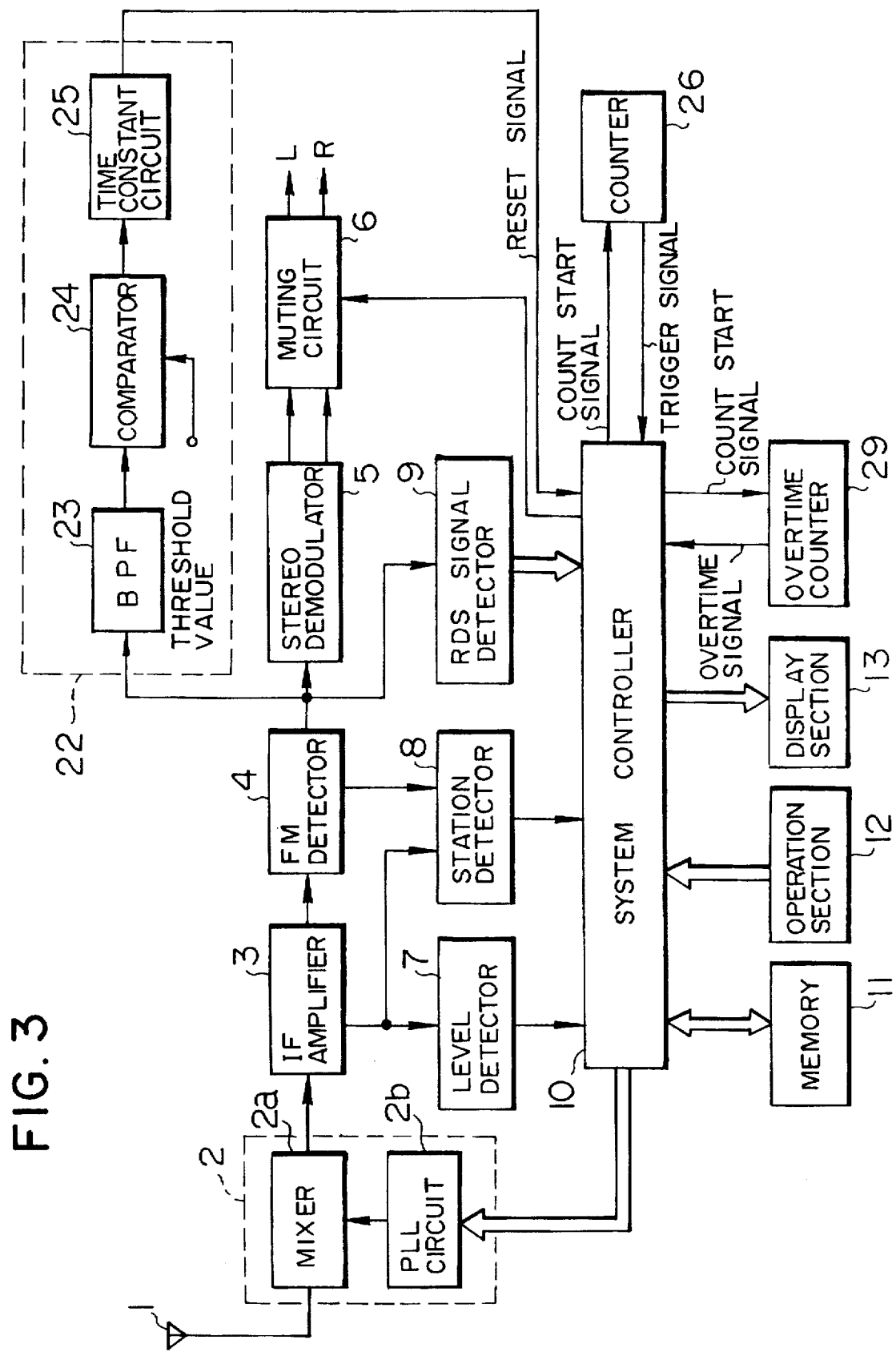
FIG. 3 is a block diagram showing one embodiment of the present invention.
Figure 4:
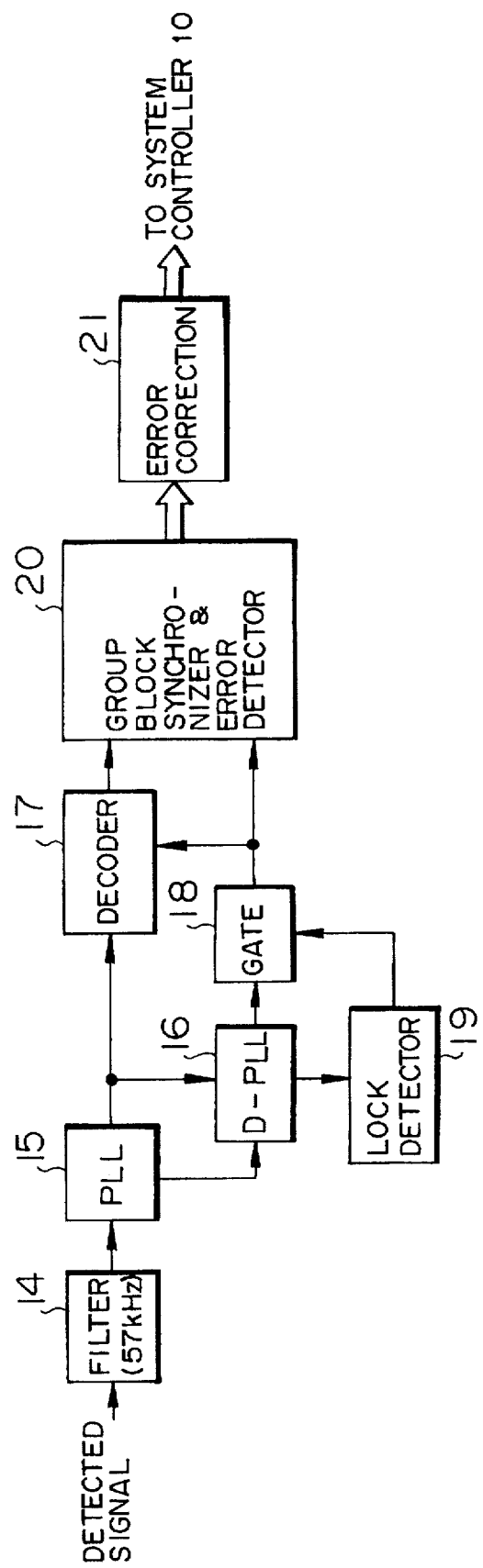
FIG. 4 is a block diagram showing the specific structure of an RDS signal detector.

FIG. 3 shows an RDS receiver as one embodiment of the present invention. In the RDS receiver, an FM broadcast wave containing an RDS signal in a multiplexed form is received at an antenna 1. A radiowave from a desired broadcasting station is selected and converted to a signal having an intermediate frequency (IF) of 10.7 MHz in a front-end 2. The IF signal is then amplified by an IF amplifier 3. The front-end 2 comprises a mixer 2a and a PLL (Phase Locked Loop) circuit 2b which includes a programmable frequency divider (not shown). A local oscillator signal to be supplied to the mixer 2a is obtained by a PLL synthesizer system using this PLL circuit 2b. The frequency dividing ratio of the programmable frequency divider is controlled by a system controller 10 to tune to the desired broadcasting station.

An FM signal of 10.7 MHz, amplified and sufficiently limited by the IF amplifier 3 is restored to an audio signal by an FM detector 4. The audio signal is then separated into an L (left) channel audio signal and an R (right) channel audio signal by a stereo demodulator 5 in the case of stereo broadcasting. Those audio signals are output as reproduced audio signals via a muting circuit 6. The RDS receiver further includes a level detector 7 and a station detector 8. The level detector 7 detects a receiving signal level (field strength) on the basis of the IF signal level in the IF amplifier 3. The station detector 8 outputs a station detection signal indicating that reception of a broadcast wave is detected, when the receiving signal level is equal to or higher than a predetermined level and the detection output of the S curve characteristic in the FM detector 4 falls within a predetermined range.

The RDS receiver further includes an RDS signal detector 9 which detects an RDS signal from the detection output from the FM detector 4. The RDS data output from the RDS signal detector 9, the receiving signal level output from the level detector 7 and the station detection signal output from the station detector 8 are all supplied to the system controller 10 which consists of a microcomputer.

The system controller 10 obtains information words, such as PI data, AF data and PS data, in the individual blocks in the RDS signal input group by group, and stores them in a memory 11. The memory 11 serves as storage means for storing AF data of broadcasting stations belonging to each network as an AF data list network by network. On the basis of a tuning command from an operation section 12 or on the basis of AF data read from the AF data list in the network follow operation, the system controller 10 controls the frequency dividing ratio of the programmable frequency divider which is one component of the front-end 2 to select the desired broadcasting station or another broadcasting station in the same network to which the broadcasting station being currently received belongs. At the time of selecting a station, the system controller 10 outputs a select signal to enable the muting circuit 6. The operation section 12 and a display section 13 are provided on the front panel of the RDS receiver. The display section 13 serves as means for informing an user that a program broadcasted from a network corresponding to a designated channel cannot be received when network identification data identifying the network corresponding to the designated channel has not been detected in the automatic station selecting function like the network follow function. The display section 13 presents a display according to a display control signal from the system controller 10.

In the RDS signal detector 9, the detected signal from the FM detector 4 is put through a filter 14 to be amplitude-modulated with a biphase-coded data signal, extracting a sub carrier of 57 kHz or RDS signal component. The RDS signal component is demodulated in a PLL circuit 15. The demodulated signal is supplied to a digital (D) PLL circuit 16 and a decoder 17. The D-PLL circuit 16 produces a clock signal for data demodulation on the basis of the demodulated signal output from the PLL circuit 15. The clock signal is supplied to a gate circuit 18. A lock detector 19 generates a lock detection signal when detecting that the D-PLL circuit 16 is locked, and supplies the detection signal to the gate circuit 18 to open this circuit 18. The decoder 17 decodes the biphase-coded data signal, which is the demodulated output of the PLL circuit 15, in synchronism with the clock signal generated by the D-PLL circuit 16.

Figure 1:
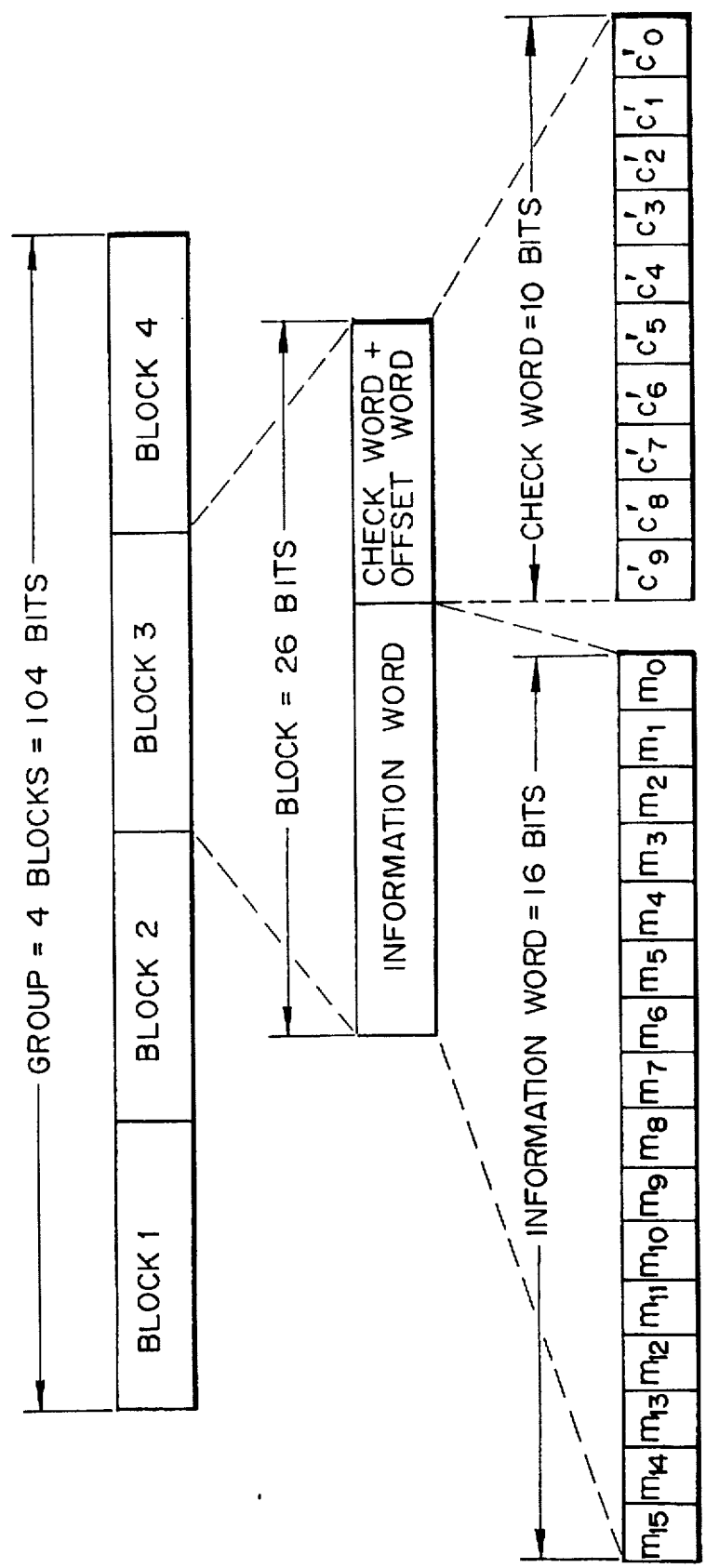
FIG. 1 is a diagram illustrating the baseband coding structure of an RDS signal.
Figure 2:
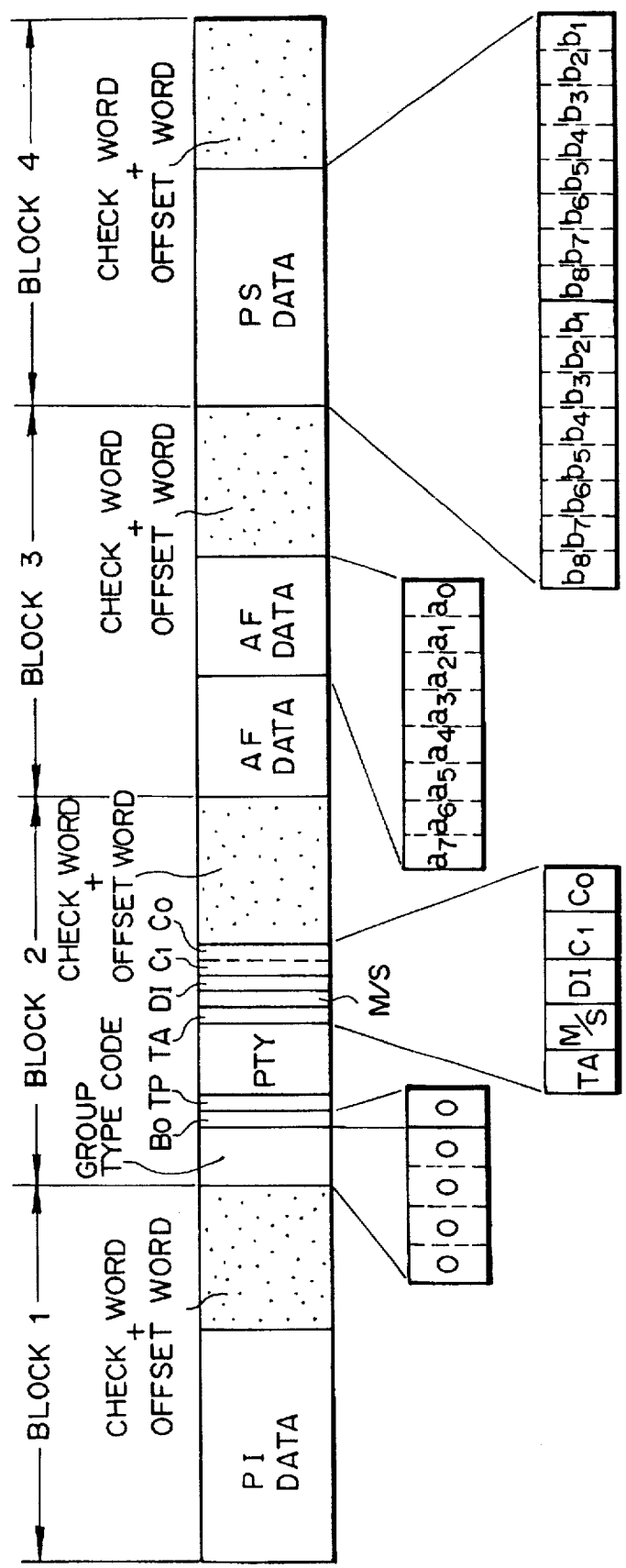
FIG. 2 is a diagram showing a format of a group of the type 0A.

The output data of the decoder 17 has a group structure of 104 bits consisting of four 26-bit blocks as shown in FIG. 1, and is supplied to a group-block synchronizer and error detector 20. The group-block synchronizer and error detector 20 performs group-block synchronization on the basis of a 10-bit offset word assigned to a 10-bit check word of each block, and detects an error in 16-bit information word on the basis of the check word. Any error-detected data is supplied to an error correcting circuit 21 provided at the next stage to correct the error, and the error-corrected data is then supplied to the system controller 10.

In the RDS receiver of the present invention, a detection output level detector 22 is connected to the detection output of the FM detector 4. The detector 22 comprises a bandpass filter (BPF) 23 connected to the detection output of the FM detector 4, a comparator 24 for comparing the output signal level of the BPF 23 with a threshold value, and a time constant circuit 25 which smooths the output signal of the comparator 24. The BPF 23 extracts an L+R (left channel signal+right channel signal) component in the output signal of the FM detector 4, for example. The time constant circuit 25 consists of, for example, a low-pass filter. The output of the detection output level detector 22 is connected to the system controller 10. Further connected to the system controller 10 are counters 26 and 29 which serve as timers to count clock pulses produced from clock generation means (not shown). The counter 26 starts counting from an initial value in response to a count start signal from the system controller 10, and generates a trigger signal when the counted value reaches a previously set reference value which is equivalent to a first predetermined time. The trigger signal is supplied to the system controller 10. The counter 29 also starts counting from an initial value in response to the count start signal from the system controller 10, and generates an overtime signal when counting a predetermined overtime value which is equivalent to a second predetermined time longer than the first predetermined time. The overtime signal is supplied to the system controller 10.

In the RDS receiver having the above mentioned constitution, the system controller 10 controls the value of current receiving frequency data which determines the frequency dividing ratio of the programmable frequency divider of the PLL circuit 2b to perform tuning in accordance with the tuning operation of the operation section 12 by the user.

Assuming a broadcasting station A has been selected and its radiowave is actually received, a signal indicative of the signal level of the received radiowave is obtained from the level detector 7 and a station detection signal is obtained from the station detector 8. Those signals are supplied to the system controller 10. The RDS signal detector 9 supplies the RDS signal, included in the broadcasted radiowave from the broadcasting station A, to the system controller 10. The system controller 10 acquires data such as PI data, AF data and PS data from the RDS signal and writes the acquired data into the memory 11.

In the data writing, n pieces of AF data $f_1, f_2, \ldots, f_n$ of the broadcasting stations in the same network to which the currently receiving station A belongs are stored in a predetermined area in the memory 11.

Figure 5:
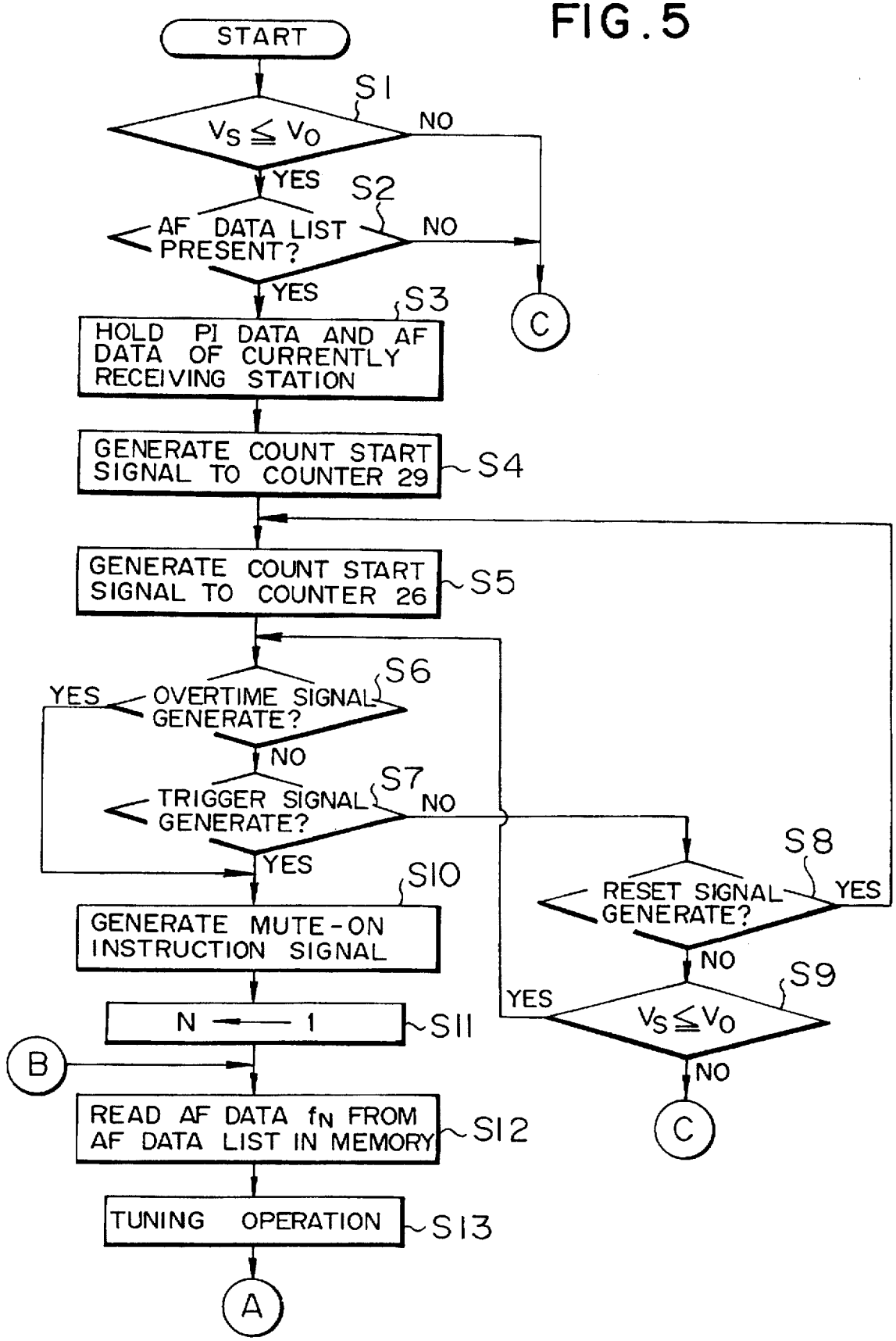
FIG. 5 is a flowchart illustrating an operation of a system controller.

The system controller 10 monitors if the receiving signal level $V_s$ obtained in the level detector 7 is equal to or lower than a set level $V_O$ at a predetermined timing to determine whether or not the reception condition of the broadcast wave of the currently receiving frequency has become poor (step S1), as shown in FIG. 5. When $V_s<V_O$, which means that the reception condition has deteriorated, it is then determined if an AF data list corresponding to the currently receiving station A is present in the memory 11 (step S2). When such an AF data list exists, the system controller 10 receives the PI data and AF data obtained from the currently receiving broadcast wave and holds those data as currently receiving station data in the memory 11 in order to start the network following operation mode (step S3). The system controller 10 generates the count start signal to the counter 29 (step S4), and also generates the count start signal to the counter 26 (step S5). The counters 29 and 26 start the counting operation from the initial values upon reception of the count start signal. Thereafter, the system controller 10 determines if the counter 29 has generated the overtime signal (step S6). When no overtime signal has been generated, the system controller 10 determines if the counter 26 has generated the trigger signal (step S7).

Figure 7A:
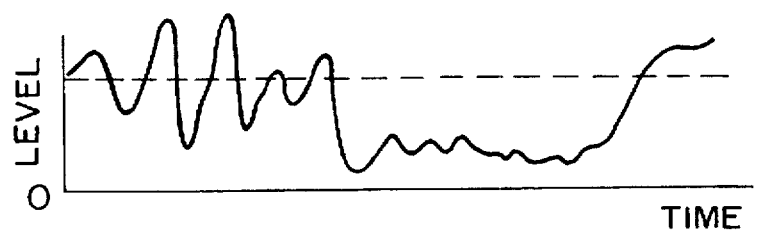
FIGS. 7A through 7C are waveform diagrams showing operations of a detection output level detector.
Figure 7B:
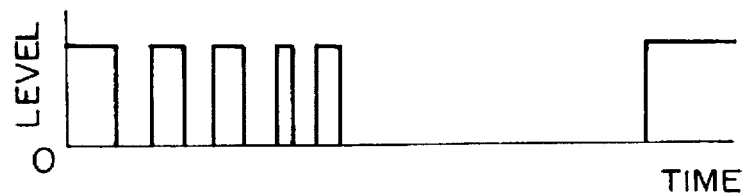
Figure 7C:
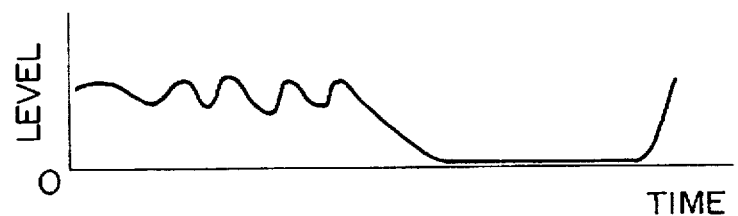

In the detection output level detector 22, the BPF 23 acquires an L+R component from the detection output signal of the FM detector 4. The obtained L+R component is compared with a threshold value by the comparator 24. Provided that the L+R component varies as indicated by a solid line in FIG. 7A, the output level of the comparator 24 becomes a high level when the L+R component is equal to or greater than the threshold value shown by a broken line in FIG. 7A, but the output level of the comparator 24 becomes a low level when the L+R component is smaller than the threshold value. That is, the output level of the comparator 24 varies as indicated in FIG. 7B. As the output signal of the comparator 24 is smoothed in the time constant circuit 25, it becomes as shown in FIG. 7C. Because of the presence of the time constant circuit 25, the output signal of the detection output level detector 22 gradually decreases toward the low level. In this embodiment, the low level is the minimum value of the output signal of the time constant circuit 25.

When the L+R component is equal to or greater than the threshold value, the output level of the comparator 24 becomes a high level and the output level of the time constant circuit 25 becomes a high level. The high-level output is supplied as a reset signal to the system controller 10. Accordingly, when no trigger signal has been generated, the system controller 10 determines if the reset signal has been generated (step S8). When the reset signal has been generated, the system controller 10 returns to step S5 to send the count start signal to the counter 26. As a result, the counter 26 restarts the counting operation from the initial value. When no reset signal has been generated, on the other hand, the system controller 10 determines if the receiving signal level $V_s$ is equal to or lower than the set level $V_O$ (step S9). This determination is made to check if the reduction in the level of the receiving signal of the current receiving station A is temporary. When $V_s>V_O$, which indicates the temporary level reduction of the receiving signal, this routine is terminated without performing the network following operation. When $V_s<V_O$, which indicates the reception condition is still poor, the system controller 10 returns to step S6 to determine again if the overtime signal has been generated. Incidentally, if the network follow operation should be executed once it is determined in step S1 that $V_s<V_O$, the determination in step S9 is unnecessary.

When the low level state of the output signal of the detection output level detector 22 in the poor reception condition continues for a first predetermined time, the counter 26 finishes counting the reference value and thus generates the trigger signal. Upon generation of the trigger signal, the system controller 10 generates a mute-ON instruction signal (step S10). If the counter 29 terminates the counting operation and generates the overtime signal before the counter 26 generates the trigger signal, i.e., if no trigger signal is generated over a second predetermined time after $V_s<V_O$, the system controller 10 proceeds to step S10 to generate the mute-ON instruction signal. In response to the mute-ON instruction signal, the muting circuit 6 becomes a cutoff state, inhibiting the supply of the right and left channel audio signals to electroacoustic conversion means (not shown) such as a loudspeaker.

Figure 6:
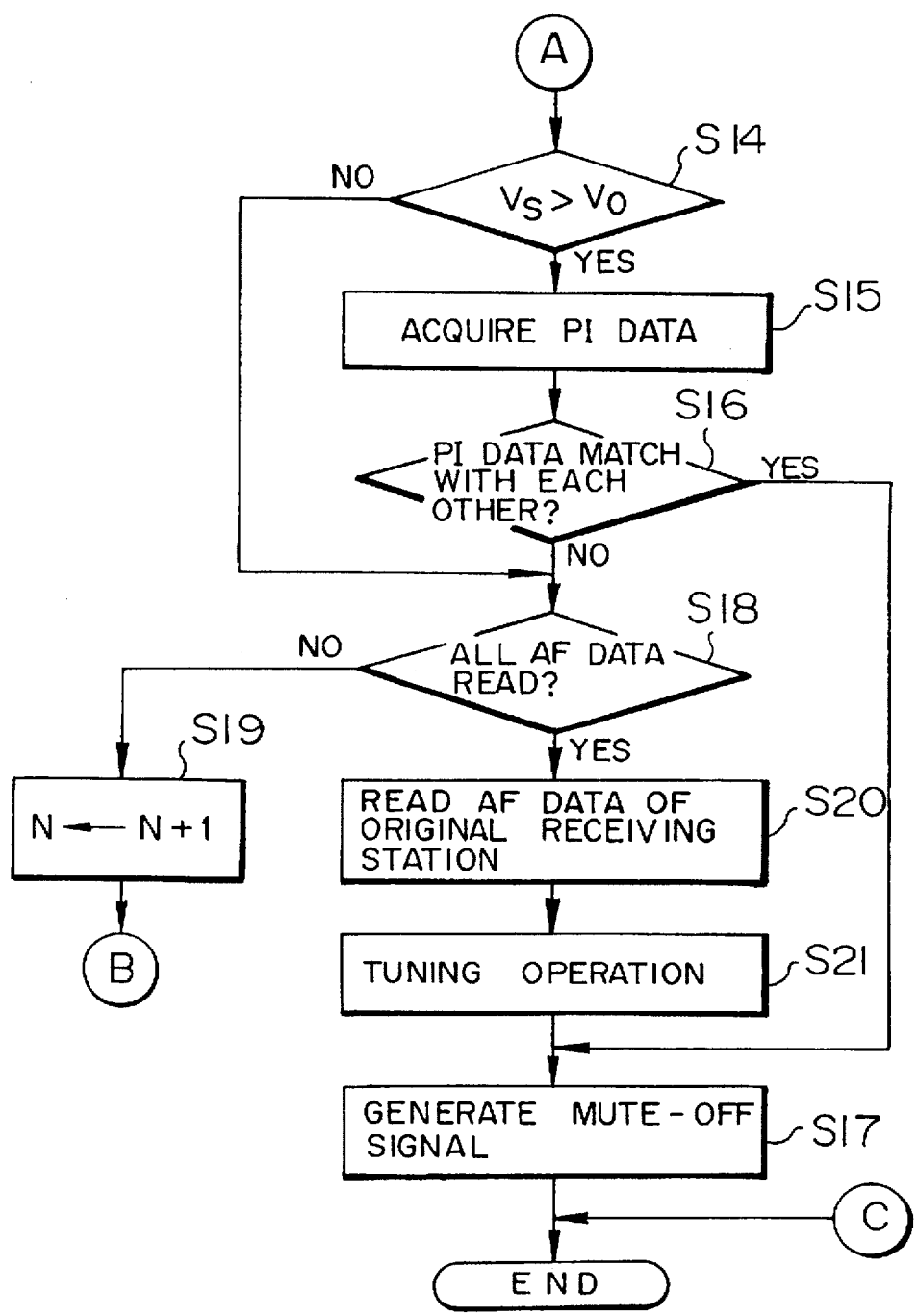
FIG. 6 is a flowchart illustrating the continuation part of the operation in FIG. 5.

When generating the mute-ON instruction signal, the system controller 10 actually starts the network follow operation. In the network follow operation, first, the system controller 10 sets a variable N to 1 (step S11), reads the N-th AF data $f_N$ in the AF data list from the memory 11 (step S12), and sends the AF data $f_N$ to the PLL circuit 2b in the front-end 2 to execute the tuning operation (step S13). Further, the system controller 10 determines if the receiving signal level $V_s$ from the level detector 7 exceeds the set level $V_O$ (step S14), as shown in FIG. 6. When $V_s>V_O$, the system controller 10 obtains PI data representing the network of the receiving station (step S15) and determines if the obtained PI data matches with the PI data held as the currently receiving station data in the memory 11 (step S16).

When both PI data match with each other in step S16, it means that some broadcasting station in the same network which can provide a reception intensity equal to or greater than the set level $V_O$ has been selected, so that the system controller 10 generates a mute-OFF instruction signal to terminate the network follow operation (step S17). In response to the mute-OFF instruction signal, the muting circuit 6 is enabled to pass an incoming signal and starts supplying the right and left channel audio signals to the electroacoustic conversion means. It is therefore possible to obtain the audio output of the program from a station belonging to the same network as the one whose program had been received immediately before activation of the network follow operation.

When it is determined in step S14 that $V_s < V_O$, which means that the receiving signal level at the time of receiving by the AF data $f_N$ is low, the flow proceeds to step S18. When it is determined in step S16 that both PI data do not match with each other, the received broadcast wave differs from that of the broadcasting station indicated by the PI data held as the currently receiving station data, so that the flow also proceeds to step S18. In step S18, it is determined whether or not all the AF data $f_1, f_2, \ldots, f_n$ in the AF data list stored in the predetermined area in the memory 11 have been read, i.e., whether or not N=n. When it is determined that not all the AF data in the AF data list have been read (N<n), the variable N is incremented by 1 (step S19) after which the flow returns to step S12 to read new AF data from the AF data list.

When all the AF data in the AF data list have been read out, other broadcast waves of the same network to which the previously receiving station A cannot be received at the field strength greater than the set level $V_O$, so that the AF data held as the currently receiving station data is read from the memory 11 to return to the reception condition of the previous receiving station A (step S20). Then, the read AF data is sent to the PLL circuit 2b to perform tuning (step S21) after which the flow proceeds to step S17 to release the cutoff state of the muting circuit 6.

The output signal of the comparator 24 is smoothed in the time constant circuit 25 in the above-described embodiment. The time constant circuit 25 is provided to prevent the counter 26 from being reset by a change in the output level of the comparator 24. Thus, the circuit 25 is not essential.

When a broadcasting station in the same network which can provide a reception intensity equal to or greater than the set level $V_O$ is selected, the muting state is immediately released in step S17 to terminate the network follow operation in the above-described embodiment. This embodiment may be modified in such a manner that all the reception intensities of $f_1, f_2, \ldots, f_n$ in the AF data list are obtained, and the AF data which has the maximum value among those AF data is output to the PLL circuit 2b to perform the tuning operation after which the flow proceeds to step S17 to release the cutoff state of the muting circuit 6.

Although the deterioration of the reception condition is detected from the field strength (signal level) of the received signal in the above-described embodiment, the noise level may be detected instead.

Although the muting circuit 6 is connected to the output of the stereo demodulator 5 in this embodiment, the connection is not limited to the illustrated one. The muting circuit 6 may be provided anywhere as long as it is located in a low-frequency stage after the FM detector 4. For example, the muting circuit 6 may be provided between the FM detector 4 and the stereo demodulator 5 or may be provided in a low-frequency amplifier if it is located in the RDS receiver.

Figure 8:
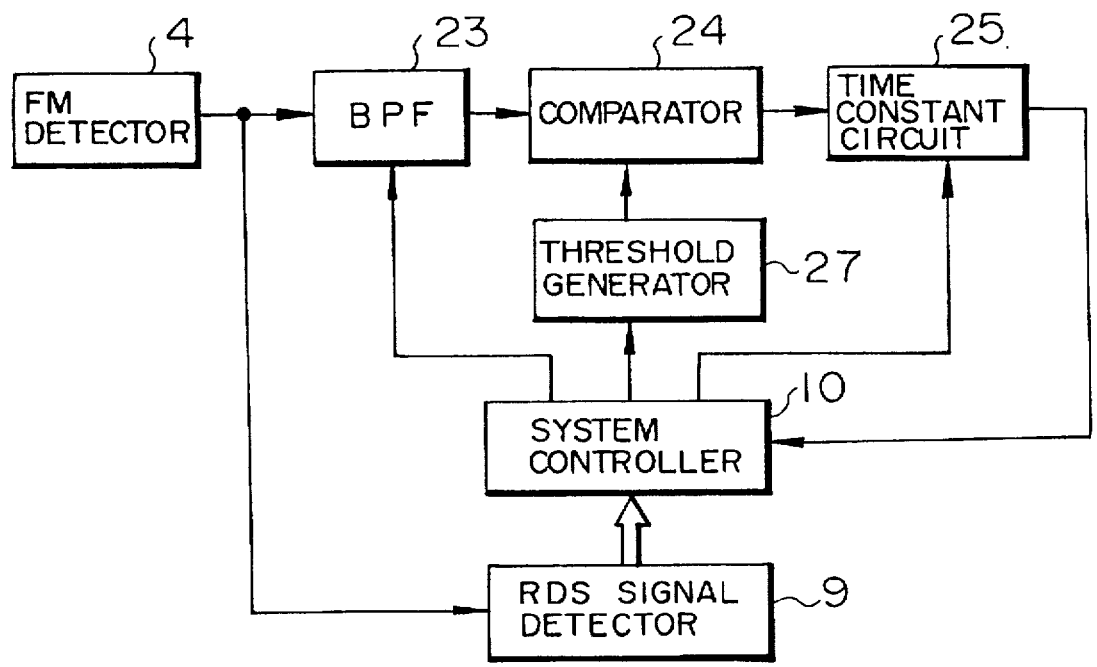
FIG. 8 is a block diagram showing another embodiment of the present invention.

FIG. 8 shows another embodiment of the present invention. In this embodiment, the system controller 10 controls at least one of the pass band of the BPF 23, the threshold value of the comparator 24 and the time constant of the time constant circuit 25 in accordance with the RDS signal detected by the RDS signal detector 9. The threshold value is generated from a threshold generator 27, so that the threshold generator 27 is controlled by the system controller 10. PTY (Program Type) data or M/S (Music/Speech) data may be used as the RDS signal to change the detection sensitivity to detect the detection output level in accordance with the content of the program in reception, such as classical music, popular music or conversation. The other structure of the receiver is the same as the one shown in FIG. 3.

Figure 9:
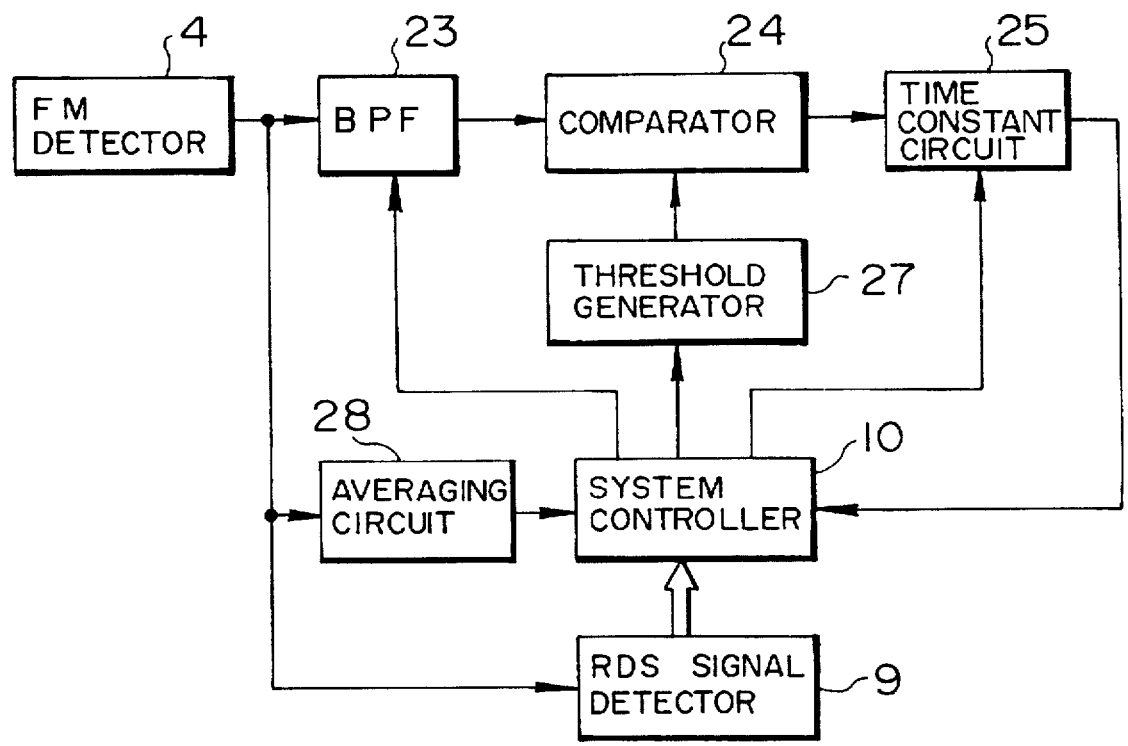
FIG. 9 is a block diagram showing a further embodiment of the present invention.

FIG. 9 shows a further embodiment of the present invention. In this embodiment, an averaging circuit 28 is connected to the output of the FM detector 4, and the output signal of the averaging circuit 28 is supplied to the system controller 10. The system controller 10 controls at least one of the pass band of the BPF 23, the threshold value of the comparator 24 and the time constant of the time constant circuit 25 in accordance with the average level of the detection output from the FM detector 4. In other words, the detection sensitivity to detect the detection output level can be switched in accordance with the magnitude of the average value of the detection signal level of the received signal. The detection sensitivity of the detection output level detector 22 may be switched in accordance with not only the average value of the detection signal level alone but also this average value plus the RDS signal.

Although the individual embodiments have been described with reference to an RDS receiver, the present invention is not limited to this particular type. For instance, the present invention may be adapted to a receiver which has no data signal detecting capability, but has a memory where reception frequencies for the individual broadcasting stations in the same network are previously stored, reads the reception frequencies from the memory as the reception condition of the broadcast wave in reception becomes poor, tests the reception of the same program at the reception frequency of another station in the same network, and actually switches the receiving station to the tested broadcasting station if the reception condition is good.

Although the current receiving frequency is automatically switched to the reception frequency of another broadcasting station in the same network whose reception condition is good in the above-described embodiments, the present invention is not limited to the structure for automatically switching the current receiving frequency among broadcasting stations in the same network. The present invention may be adapted to a receiver which simply tests the reception of broadcast waves from other broadcasting stations before the actual switching to the reception frequency of another broadcasting station (which may be a broadcasting station in a network other than the current network) and tunes to the broadcasting station with a good reception condition.

According to the receiver of the present invention, as described above, after detecting deterioration of the reception condition of a received signal, when the level of the detected signal obtained by detecting the received signal is kept equal to or lower than the threshold value for a predetermined time or longer, the muting means is set to the signal cutoff state to stop the audio output before the activation of an automatic receiving-station switching function. That is, even if the reception condition becomes poor, the muting means does not cut off an audio signal until the low level of the audio output in the currently receiving broadcasted program continues. This prevents the audio output from being suddenly cut at the time the automatic receiving-station switching function like a network follow function starts, thus suppressing the uncomfortableness of a listener.

What is claimed is:

1. A receiver with an automatic receiving-station switching function for automatically switching a current receiving frequency from a reception frequency of a broadcast wave in reception to a reception frequency of a broadcast wave of another station, which is in a good reception condition, when a reception condition of the former broadcast wave becomes poor, said receiver comprising:

detection means for detecting a signal obtained by receiving a broadcast wave;

detection level detecting means for generating a reset signal when a level of the detected signal is higher than a threshold value;

reception condition detecting means for detecting deterioration of a reception condition of the received signal;

first timer means for starting measuring a first predetermined time when said deterioration of said reception condition is detected and for restarting measuring said first predetermined time in response to said reset signal during time measurement of said first predetermined time;

mute-ON instruction signal generating means for generating a mute-ON instruction signal when said first timer means finishes measuring said first predetermined time;

muting means, inserted in a low-frequency stage to which said detected signal is supplied, for becoming a signal cutoff state in response to said mute-ON instruction signal; and means for activating said automatic receiving-station switching function after said muting means becomes said signal cutoff state.

2. The receiver according to claim 1, wherein said receiver is a radio data system receiver and a detection sensitivity of said detection level detecting means is controlled in accordance with a data signal included in said received signal.

3. The receiver according to claim 1, wherein said detection level detecting means has means for detecting an average level of said detected signal and a detection sensitivity of said detection level detecting means is controlled in accordance with said average level.

4. The receiver according to claim 1, wherein said detection level detecting means comprises a bandpass filter for obtaining a predetermined band component from said detected signal, a comparator for comparing an output signal of said bandpass filter with said threshold value, and a time constant circuit for smoothing an output signal of said comparator.

5. The receiver according to claim 4, wherein said detection level detecting means changes a detection sensitivity by changing at least one of a pass band of said bandpass filter, said threshold value and a time constant of said time constant circuit.

6. The receiver according to claim 1, further comprising second timer means for starting measuring a second predetermined time when said deterioration of said reception condition is detected, wherein said mute-ON instruction signal generating means generates said mute-ON instruction signal when said second timer means finishes measuring said second predetermined time.

* * * * *